(12) United States Patent
Lu et al.

(10) Patent No.: US 8,881,075 B2
(45) Date of Patent: Nov. 4, 2014

(54) METHOD FOR MEASURING ASSERTION DENSITY IN A SYSTEM OF VERIFYING INTEGRATED CIRCUIT DESIGN

(71) Applicant: Atrenta, Inc., San Jose, CA (US)

(72) Inventors: Yuan Lu, San Jose, CA (US); Yong Liu, Shanghai (CN); Nitin Mhaske, Santa Clara, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 13/783,635

(22) Filed: Mar. 4, 2013

(65) Prior Publication Data

US 2014/0250414 A1   Sep. 4, 2014

(51) Int. Cl.
G06F 9/455       (2006.01)
G06F 17/50      (2006.01)

(52) U.S. Cl.
CPC .................................. *G06F 17/5009* (2013.01)
USPC ........... 716/106; 716/107; 716/110; 716/111; 703/2

(58) Field of Classification Search
USPC ................................. 716/136, 106–112; 703/2
See application file for complete search history.

(56) References Cited

U.S. PATENT DOCUMENTS

| | | |
|---|---|---|
| 6,117,180 A | 9/2000 | Dave et al. |
| 6,591,402 B1 | 7/2003 | Chandra et al. |
| 6,591,403 B1 | 7/2003 | Bass et al. |
| 7,210,066 B2 | 4/2007 | Mandava et al. |
| 7,243,090 B2 | 7/2007 | Kinshalin et al. |
| 7,281,185 B2 | 10/2007 | Maoz et al. |
| 7,458,046 B2 | 11/2008 | Ghosh et al. |
| 7,493,247 B2 | 2/2009 | Memmi |
| 7,685,547 B1 | 3/2010 | Gupta et al. |
| 7,788,615 B2 | 8/2010 | Baumgartner et al. |
| 7,844,929 B2 | 11/2010 | Chaturvedula et al. |
| 7,865,339 B2 | 1/2011 | Rushby et al. |
| 7,900,181 B2 | 3/2011 | Hekmatpour et al. |
| 8,042,078 B2 * | 10/2011 | Paruthi et al. ................. 716/106 |
| 8,121,825 B2 | 2/2012 | Jain et al. |
| 8,244,516 B2 | 8/2012 | Arbel et al. |
| 8,271,253 B2 | 9/2012 | Ward |
| 8,413,088 B1 * | 4/2013 | Armbruster et al. .......... 716/106 |
| 2006/0268724 A1 | 11/2006 | Viswanath et al. |
| 2006/0282807 A1 * | 12/2006 | Ivancic et al. ..................... 716/5 |
| 2008/0072196 A1 * | 3/2008 | Hekmatpour et al. ............ 716/5 |
| 2008/0104556 A1 * | 5/2008 | Yamada ........................... 716/5 |

(Continued)

OTHER PUBLICATIONS

Thesis on information and system engineering C42, by Maksim Jenihhin, "Simulation-Based Hardward Verification with High-Level Decision Diagrams", for doctoral degree Dec. 8, 2008, Tallinn University of Technology, 156 pages.

*Primary Examiner* — Nha Nguyen
(74) *Attorney, Agent, or Firm* — Thomas Schneck; Mark Protsik

(57) ABSTRACT

An assertion-based verification tool for circuit designs includes an effective measurement of assertion density for any given generated set of assertions. A register-transfer level (RTL) description of an integrated circuit (IC) is used to compute a set of predicates. Then, determination is made as to the number of predicates that are satisfiable on the given set of assertions received respective of the RTL description. Thereafter, simulation traces for the RTL are received and the number of predicates satisfiable on the simulation traces is computed. A figure of merit of assertion density is determined from the ratio of the respective numbers of predicates. The set of assertions may be modified as required to satisfy a predetermined threshold value of assertion density, to assure that a circuit is rigorously tested by the verification tool.

14 Claims, 3 Drawing Sheets

(56) References Cited

U.S. PATENT DOCUMENTS

| | | |
|---|---|---|
| 2009/0125290 A1* | 5/2009 | Chatterjee et al. ............. 703/13 |
| 2009/0172529 A1* | 7/2009 | Jas et al. ....................... 715/700 |
| 2010/0070937 A1* | 3/2010 | Nishide ............................ 716/4 |
| 2010/0088257 A1 | 4/2010 | Lu et al. |
| 2010/0269078 A1 | 10/2010 | Dsouza |
| 2011/0173592 A1 | 7/2011 | Elnozahy et al. |
| 2012/0123763 A1 | 5/2012 | Jain et al. |
| 2013/0019216 A1* | 1/2013 | Vasudevan et al. ........... 716/106 |
| 2013/0019217 A1* | 1/2013 | Brinkmann ................... 716/106 |

* cited by examiner

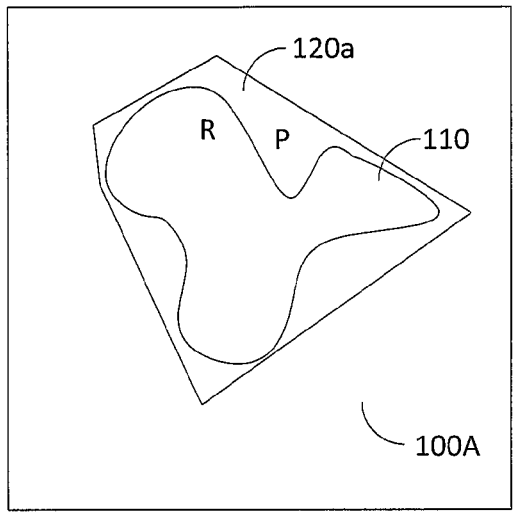
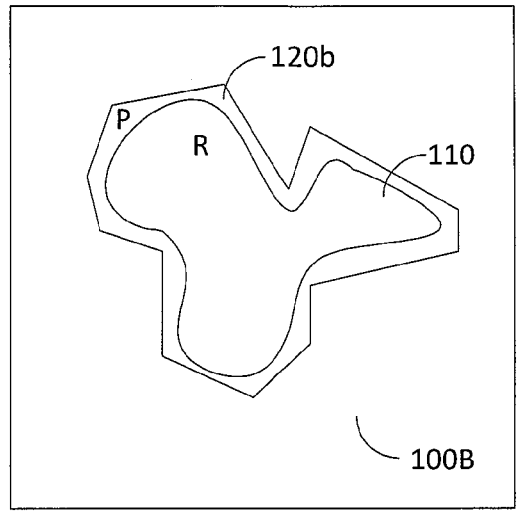
FIGURE 1A
FIGURE 1B
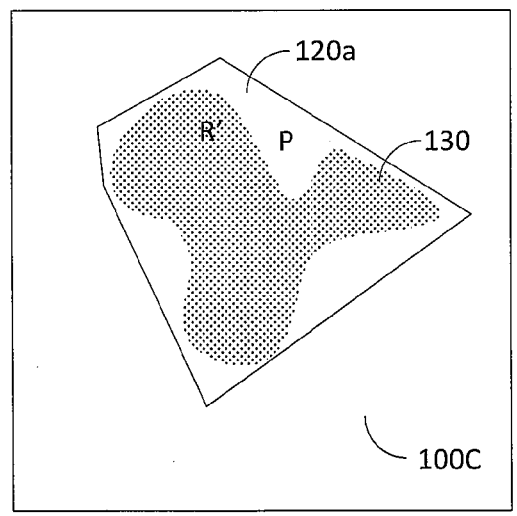
FIGURE 1C

METHOD FOR MEASURING ASSERTION DENSITY IN A SYSTEM OF VERIFYING INTEGRATED CIRCUIT DESIGN

TECHNICAL FIELD

The invention generally relates to optimization of a set of assertions for computerized circuit design verification using a measure of assertion density, and more particularly to an improved system and method for measuring assertion density.

BACKGROUND ART

As part of the verification process for circuit design, it is useful to use assertions. Assertions are Boolean expressions reflecting the constraints on the circuit's outputs. During a simulation testing the functionality of a circuit, assertions may detect defects whose effects are not necessarily propagated to a primary output. Effective use of assertions implies that a set of assertions is sufficient to cover the functionality of the circuit logic as defined by the register-transfer level (RTL). It is further useful to define an assertion density metric, to ensure that a set of assertions sufficiently covers the functionality of the circuit logic.

There are two primary methods of measuring assertion density. The first is known as Cone of Influence (COI). In this method the assertion is defined by the number of logic gates affected, and it is desired that the assertion will effect a large as possible number of logic gates. A cone is thus defined with a tip originating at the output and a base at the first available register. The second method is known as Minimal Sequential Depth (MSD). MSD uses COI; however, the MSD is defined by the number of registers within the cone. It is desired to have a high as possible COI and low as possible MSD. The higher the COI or lower the MSD, the better the assertion is. It is of note that both methods are syntax-based and do not reflect functionality.

It is therefore further noted that the prior art does not provide an effective way of measurement of assertion density which is required in order to satisfactorily ascertain that a circuit is well-enough covered. Providing such a method within a system for design and verification of integrated circuit would be advantageous.

SUMMARY DISCLOSURE

A computerized method is provided for determining assertion density, which is then used in a method to optimize generation of assertions for verifying an integrated circuit (IC) design, such that the set of assertions will have an assertion density measure that exceeds a predetermined threshold value for efficient design verification. Measurement of assertion density begins by receiving a register-transfer language (RTL) description of an integrated circuit. From this RTL description a set of predicates (Ci) is computed. A set of assertions that has been generated is next received and a first value for the number of predicates which are satisfiable on the set of assertions with RTL as base is computed. Likewise a set of simulation traces is received and a second value for the number of predicates which are satisfiable on the simulation traces is computed. A figure of merit for assertion density is then determined based on predetermined criteria respective of those two values.

The computation of assertion density may be repeated for other received sets of assertions until the figure of merit for assertion density meets predetermined criteria for one of the sets. Also, one or more graphs of the number of predicates which are satisfiable on the various received sets of assertions and of the number of predicates which are satisfiable on the simulation traces may be plotted.

BRIEF DESCRIPTION OF THE DRAWINGS

FIG. 1A is a schematic illustration representing reachable states for a given circuit and a set of assertions.

FIG. 1B is a schematic illustration representing reachable states for a given circuit and a preferred set of assertions.

FIG. 1C is a schematic illustration representing discrete states for a given circuit and a set of assertions.

DETAILED DESCRIPTION

Figure 2:
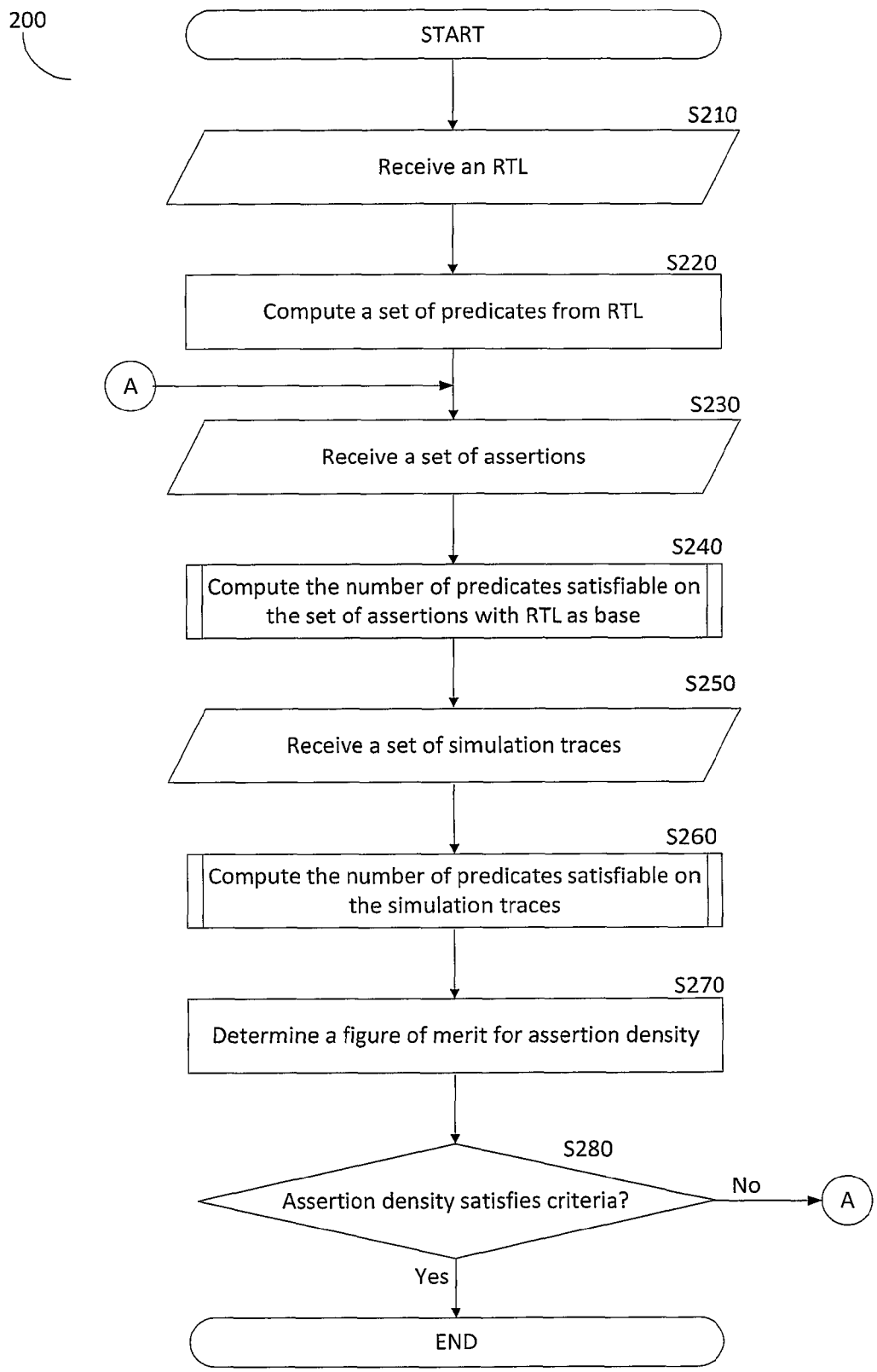
FIG. 2 is a flowchart of the method of improved measurement of assertion density.

An effective measurement of the assertion density is required to satisfy that a circuit has been rigorously tested. An attempt is made to reach as close as possible to an ideal figure of merit for assertion density given a set of assertion. A register-transfer level (RTL) description of an integrated circuit (IC) is used to compute a set of predicates. Then, determination is made as to the number of predicates that are satisfiable on the given set of assertions received respective of the RTL description. Thereafter receiving simulation traces for the RTL and computing the number of predicates satisfiable on the simulation traces. A figure of merit is then determined responsive of the number of predicates computed and achieving a value which is below a predetermined threshold. The progress of such iterations can also be graphically presented to a user, for example on a screen of a development tool.

Reference is now made to FIGS. 1A, 1B and 1C, which are schematic illustrations representing examples of the achievable states of a given IC or portion thereof. FIG. 1A is a representation in state-space, i.e., a space in which every point in space 100 corresponds to a possible state of a given logic circuit. In space 100A a set of reachable states 110 is defined as an area, also referenced by the letter "R". In state-space, the area defined by reachable states 110 must be confined within the boundary defined by a set of assertions 120a (also referenced by the letter "P") for the assertions to provide full cover of the functionality of the logic circuit. For clarification it is understood that any state of the circuit TRUE in R is also TRUE in P. It is further evident that the best assertion possible is by definition R. FIG. 1B is a representation in state-space 100B of a different set of assertions 120b which provide a more accurate representation of reachable states 110. It is more efficient for a circuit designer to provide a set of assertions corresponding to R in a manner where |P−R|/|R| is near zero as possible (where |P−R| are the number of states in P but not in R). The expression |P−R|/|R| defines assertion quality. This expression is theoretical and has no practical use as R is a theoretical boundary of reachable states which is unknown and it is impossible to compute |R|. FIG. 1C is a representation in state-space 100C of a discrete number of reachable states (also referenced R'). A large, yet finite, number of discrete reachable states 130 may sufficiently represent the reachable states 110. R' implies R, i.e., any state TRUE in R' is TRUE in R. A novel definition of assertion quality is therefore defined by |P−R'|/|R'|, or in other words, determines how good the assertion density really is.

FIG. 2 depicts an exemplary and non-limiting flowchart 200 describing the method of improved determination of an assertion density. In S210 an RTL of an IC, or portion thereof, is provided. In S220 a set of predicates $C_i$ is computed from the received RTL. In S230 a set of assertions (P) is provided. In S240 the number of predicates $C_i$ which are satisfiable on the set of assertions (P) with RTL as base are computed. A predicate $C_i$ is satisfiable on P if there exists a state where both P and $C_i$ are TRUE (i.e., P & $C_i$ is TRUE). In S250 a set of simulation traces (R') are provided. In S260 the number of predicates $C_i$ which are satisfiable on R' are computed. Likewise, a predicate $C_i$ is satisfiable on R' if there exists a state where both P and $C_i$ are TRUE (i.e. R' & $C_i$ is TRUE). As by comparing the values received over a large number of cycles it is possible to compare P & $C_i$ to R' & $C_i$ and determine the accuracy of approximation of P, a figure of merit respective of the assertion density is computed in S270. In S280 it is checked whether the figure of merit satisfies predetermined criteria, e.g., a threshold value, and if not, execution continues with S230; otherwise, execution terminates. The figure of merit for assertion density guides hardware designers and verification engineers to further develop better assertions.

Figure 3:
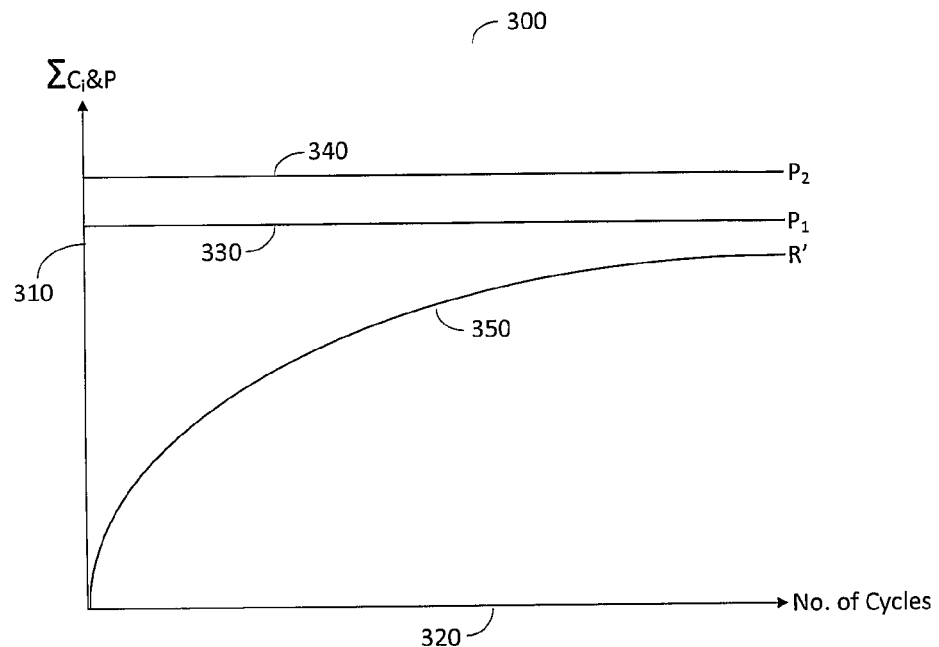
FIG. 3 is an exemplary plot of the number of cycles against the number of satisfied predicates on the set of assertions.

Reference is now made to exemplary and non-limiting FIG. 3, which is a plot 300 of the number of cycles 320 against the number of satisfied predicates on the set of assertions 310. Curve 330 represents a set of assertions satisfied by the predicates, also referenced as "P1". Curve 340 represents a set of assertions satisfied by the predicates, also referenced as "P2". Curve 350 represents the number of predicates satisfiable on R'. The set of simulation traces R' increases from cycle to cycle. Curve 350 has a saturation limit defined by R. Therefore, it is easy to visualize a set of assertions approaching this boundary. In the example of FIG. 3 it is evident that curve 330 is a more accurate representation of the saturation limit than curve 340. The circuit designer has now learned that assertions P1 more efficiently and more accurately describe R than set of assertions P2.

Figure 4:
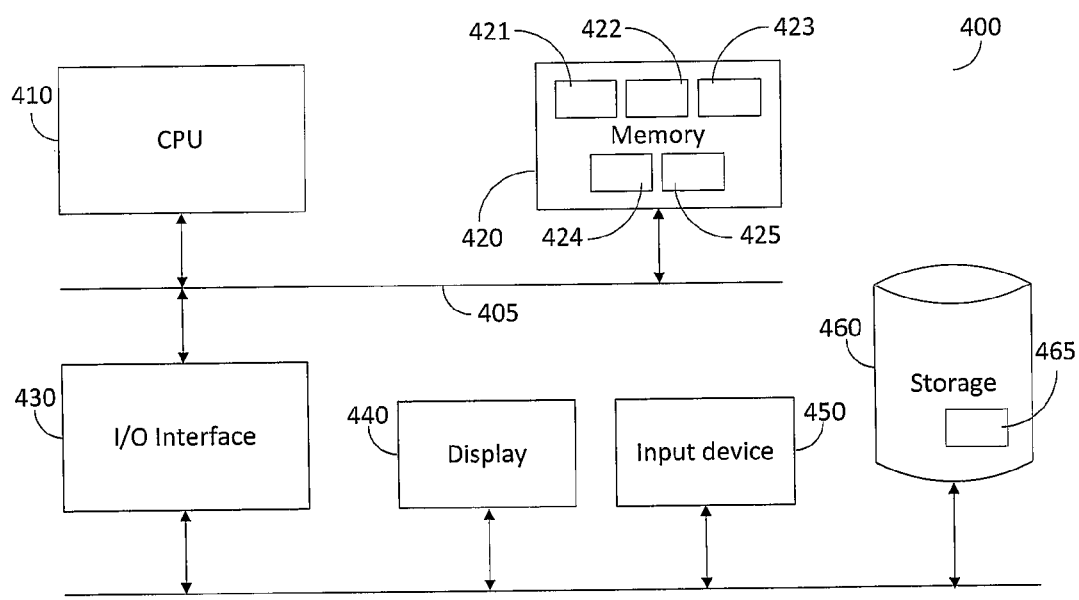
FIG. 4 is a system implemented according to the method and principles of the disclosed technique.

FIG. 4 show an exemplary and non-limiting system 400, such as a computer aided design (CAD) system, implemented according to the principles of the invention disclosed herein. The system 400 comprises a processing element 410, for example, central processing unit (CPU), which is coupled via a bus 405 to a memory 420 and an input/output (I/O) interface 430. The memory 420 further comprises a memory portion 421 used for containing RTL information, a memory portion 422 used for containing predicates computed by the CPU 410 from the RTL information, a memory portion 423 used for containing a set of assertions P, a memory portion 424 used for containing the number of predicates satisfied on the set of assertions P and a memory portion 425 used for containing the number of predicates satisfied on the set of simulation traces R'. The I/O interface 430 may be coupled to a display unit 440, e.g., a computer screen, an input device 450, e.g., a mouse and/or a keyboard, and data storage 460. Data storage 460 may be used for the purpose of holding the steps of the method executed in accordance with the disclosed technique and, for example, may cause the display of a plot of the number of cycles against the number of satisfied predicates on the set of assertions. Data storage 460 may further comprise storage portion 465 containing the aforementioned plot and data points for generating the same.

To implement the assertion generation and optimization method using an improved measure of assertion density in accord with the invention, a computer system comprises a processing unit, an input/output (I/O) interface coupled to the processing unit, and a memory containing software instructions that when executed by the processing unit receive a register-transfer language (RTL) description of an integrated circuit via the I/O interface, compute a set of predicates from that received RTL description, generate or receive a set of assertions, compute a first value respective of the number of predicates which are satisfiable on the set of assertions with the RTL description as base, receive a set of simulation traces, compute a second value respective of the number of predicates which are satisfiable on the simulation traces, determine a figure of merit for assertion density based upon predetermined criteria respective of the first and second values, and as needed repeat the computations with other generated or received sets of assertions until a predetermined assertion density threshold is achieved with one of them.

Hence, the principles of the invention may be implemented as hardware, firmware, software tangibly embodied in computer readable and non-transient media, or any combination thereof, including but not limited to a CAD system and software products thereof, the software designed to execute on an appropriate apparatus for execution of the plurality of instructions that are contained in the software. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit and/or display unit.

What is claimed is:

1. A method implemented in a programmable system for verifying a design of an integrated circuit, comprising:
   a) providing a register-transfer language description of the integrated circuit to the system;
   b) generating a set of assertions sufficient to test a functionality of the integrated circuit;
   c) measuring an assertion density of the set of assertions, wherein the assertion density is measured by a comparison of a number of predicates computed from the description that are satisfiable on the set of assertions relative to a number of predicates satisfiable on a set of simulation traces of the integrated circuit;
   d) comparing the measured assertion density with a predetermined threshold;
   e) repeatedly modifying the set of assertions or generating a new set of assertions, and re-measuring the assertion density until the measured assertion density exceeds said threshold; and
   f) applying the particular set of assertions for which assertion density exceeds said threshold to a design verification of the integrated circuit.

2. The method as in claim 1, wherein modifying the set of assertions includes eliminating redundant assertions so as to consolidate the set of assertions for a higher assertion density.

3. The method as in claim 1, further comprising storing each successive set of assertions in a computer-readable memory.

4. The method as in claim 1, wherein applying the set of assertions comprises running within the computer a software verification tool using the register-transfer language description of the integrated circuit design and the set of assertions that exceeds the threshold.

5. The method as in claim 1, wherein the programmable system in which the method is implemented is selected from any one of a computer system, a processing unit, or a computer-aided design (CAD) system.

6. A data processing system for performing an assertion-based verification of an integrated circuit design, comprising:
   a processing unit;
   an input/output (I/O) interface coupled to the processing unit; and
   a memory assessable by the processing unit via the interface, the memory having storage locations for a register-transfer language description of an integrated circuit design to be verified, a set of predicates computed from the description, a set of assertions, a set of simulation traces, and a set of program instructions of a software verification tool that when executed by the processing unit causes the data processing system to:
      receive a register-transfer language (RTL) description of an integrated circuit (IC) via the I/O interface and store the description in the memory;
      compute a set of predicates (Ci) from the RTL description and store the computed predicates in the memory;
      receive and store a set of simulation traces corresponding to the integrated circuit;
      generate a set of assertions sufficient to test a functionality of the integrated circuit;
      measure an assertion density of the set of assertions, wherein the assertion density is measured by a comparison of a number of predicates computed from the description that are satisfiable on the set of assertions relative to a number of predicates satisfiable on a set of simulation traces of the integrated circuit;
      compare the measured assertion density with a predetermined threshold;
      repeatedly modify the set of assertions or generate a new set of assertions, and re-measure the assertion density until the measured assertion density exceeds said threshold, each successive set of assertions with a greater assertion density than a previous set being stored in the memory; and
      apply the particular set of assertions for which assertion density exceeds said threshold to a design verification of the integrated circuit.

7. The system as in claim 6, wherein the program instructions modifying the set of assertions includes eliminating redundant assertions so as to consolidate the set of assertions for a higher assertion density.

8. The system as in claim 6, wherein applying the set of assertions comprises running the software verification tool within the processing unit, using the register-transfer language description of the integrated circuit design and the stored set of assertions that exceeds the threshold.

9. The system as in claim 6 that comprises a programmable general-purpose computer system or a computer-aided design (CAD) system.

10. A computerized method for determining assertion density, comprising:
    receiving a register-transfer language (RTL) description of an integrated circuit (IC);
    computing, by using a computer, a set of predicates (Ci) from the RTL;
    receiving a set of assertions;
    computing, by using a computer, a first value respective of the number of predicates which are satisfiable on the set of assertions with RTL as base;
    receiving a set of simulation traces;
    computing, by using a computer, a second value respective of the number of predicates which are satisfiable on the simulation traces;
    determining, by using a computer, a figure of merit for assertion density respective of the first value and the second value based on a predetermined criteria, and repeating: (1) receiving a new set of assertions; (2) computing, by using a computer, a first value respective of the number of predicates which are satisfiable on the new set of assertions with RTL as base; (3) receiving a set of simulation traces; (4) computing a second value respective of the number of predicates which are satisfiable on the simulation traces; and, (5) determining, by using a computer, a figure of merit respective of the first value and the second value being below a predetermined threshold value, until the figure of merit for assertion density meets a predetermined criteria.

11. The computerized method of claim 10, further comprising plotting, by using a computer, a graph of the number of predicates which are satisfiable on P with RTL as base.

12. The method of claim 10, further comprising plotting, by using a computer, a graph of the number of predicates which are satisfiable on the simulation traces.

13. A system for determining assertion density, comprising:
    a processing unit;
    an input/output (I/O) interface coupled to the processing unit; and,
    a memory containing instructions that when executed by the processing unit:
       (a) receive a register-transfer language (RTL) description of an integrated circuit (IC) via the I/O interface;
       (b) compute a set of predicates (Ci) from the RTL;
       (c) receive a set of assertions;
       (d) compute a first value respective of the number of predicates which are satisfiable on the set of assertions with RTL as base;
       (e) receive a set of simulation traces;
       (f) compute a second value respective of the number of predicates which are satisfiable on the simulation traces;
       (g) determine a figure of merit for assertion density respective of the first value and the second value based upon a predetermined criteria, and
       (h) repeat steps (c) through (g) with at least one new set of assertions until the determined figure of merit meets the predetermined criteria.

14. The system as in claim 13 that comprises a programmable general-purpose computer system or a computer-aided design (CAD) system.

* * * * *